US008405459B2

(12) United States Patent
Maruyama

(10) Patent No.: US 8,405,459 B2
(45) Date of Patent: Mar. 26, 2013

(54) FOLDED CASCODE DIFFERENTIAL AMPLIFIER AND SEMICONDUCTOR DEVICE

(75) Inventor: Tetsuji Maruyama, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 13/064,935

(22) Filed: Apr. 27, 2011

(65) Prior Publication Data

US 2011/0291760 A1 Dec. 1, 2011

(30) Foreign Application Priority Data

May 27, 2010 (JP) .................................. 2010-122011

(51) Int. Cl.
  *H03F 3/45* (2006.01)
(52) U.S. Cl. ....................................... 330/257; 330/255
(58) Field of Classification Search .................. 330/253, 330/255, 257
  See application file for complete search history.

(56) References Cited

U.S. PATENT DOCUMENTS

| 6,018,267 A * | 1/2000 | Tran et al. ...................... 330/255 |
| 6,064,267 A * | 5/2000 | Lewyn .......................... 330/257 |
| 7,209,005 B2 * | 4/2007 | Martins ........................ 330/257 |
| 7,612,615 B1 * | 11/2009 | Hou ............................. 330/255 |
| 2009/0224830 A1 * | 9/2009 | An et al. ........................ 330/257 |

FOREIGN PATENT DOCUMENTS

| JP | 2005-025596 A | 1/2005 |
| JP | 2007-148428 A | 6/2007 |
| JP | 2009-070211 A | 4/2009 |

* cited by examiner

*Primary Examiner* — Khanh V Nguyen
(74) *Attorney, Agent, or Firm* — Rabin & Berdo, P.C.

(57) ABSTRACT

A folded cascode differential amplifier includes a high-voltage input stage and a low-voltage output stage. The input stage is formed from high-voltage MOS transistors, two of which constitute a differential pair. The output stage is formed from low-voltage MOS transistors, some of which constitute a current mirror circuit connected to the differential pair. The output stage also includes at least one transistor that amplifies a voltage produced in the current mirror circuit to generate an output voltage signal. The high-voltage MOS transistors have higher breakdown voltages than the low-voltage MOS transistors. Incorporation of both types of transistors into a single amplifier reduces the necessary number of transistors and the necessary number of bias voltages.

11 Claims, 11 Drawing Sheets

FOLDED CASCODE DIFFERENTIAL AMPLIFIER AND SEMICONDUCTOR DEVICE

BACKGROUND OF THE INVENTION

1. Field of the Invention

The present invention relates to a folded cascode differential amplifier having both high-voltage and low-voltage transistors, and to a semiconductor device including the amplifier and its bias circuit.

2. Description of the Related Art

Differential amplifiers used in liquid crystal displays, for example, have inputs that may vary over a wide common-mode voltage range, even though the differential input voltage range is comparatively small and the output voltage range may be even smaller. A conventional differential amplifier of this type employs two folded cascode differential amplifiers, using one as an input stage and the other as an output stage. The input amplifier has high-voltage transistors and operates on a relatively high power supply voltage. The output amplifier has low-voltage transistors and operates on a relatively low power supply voltage.

Since each of the two folded cascode differential amplifiers has a large number of transistors, one problem with this conventional two-stage design is that it takes up considerable space. A further problem is large output error, due to inaccurate matching of resistance ratios and to offset inaccuracies. Further details will be given in the detailed description of the invention.

Other examples of amplifiers used in liquid crystal displays can be found in, for example, Japanese Patent Application Publications No. 2009-070211, 2007-148428, and 2005-025596.

SUMMARY OF THE INVENTION

An object of the invention is to reduce the size of a differential amplifier having a high-voltage input stage and a low-voltage output stage.

Another object of the invention is to improve the accuracy of a differential amplifier having a high-voltage input stage and a low-voltage output stage.

The invention provides a novel folded cascode differential amplifier that includes an input stage operating on a first power supply voltage and an output stage operating on a lower second power supply voltage.

The input stage is formed from a first plurality of metal-oxide-semiconductor (MOS) transistors, two of which constitute a differential pair that receive respective input voltage signals. The output stage is formed from a second plurality of MOS transistors, some of which constitute a current mirror circuit connected to the differential pair. The second plurality of MOS transistors also includes at least one transistor forming an amplifying circuit that amplifies a voltage produced in the current mirror circuit to generate an output voltage signal.

The first plurality of MOS transistors have higher breakdown voltages than the second plurality of MOS transistors.

The incorporation of transistors with both comparatively high and comparatively low breakdown voltages into a single folded cascode differential amplifier, instead of having separate high-voltage and low-voltage folded cascode differential amplifiers, saves space by reducing the total number of transistors required.

Accuracy is improved because the reduced number of transistors reduces error due to manufacturing variability, and because there are fewer external resistor connections to be made, reducing error due to imprecise resistance values.

The invention also provides a semiconductor device including the novel folded cascode differential amplifier and a bias circuit. The bias circuit includes a constant current source, a current mirror circuit powered by the first power supply voltage, and a current mirror circuit powered by the second power supply voltage. The size of the bias circuit is comparatively small because there are comparatively few transistors to be biased in the novel folded cascode differential amplifier.

DETAILED DESCRIPTION OF THE INVENTION

Figure 1:
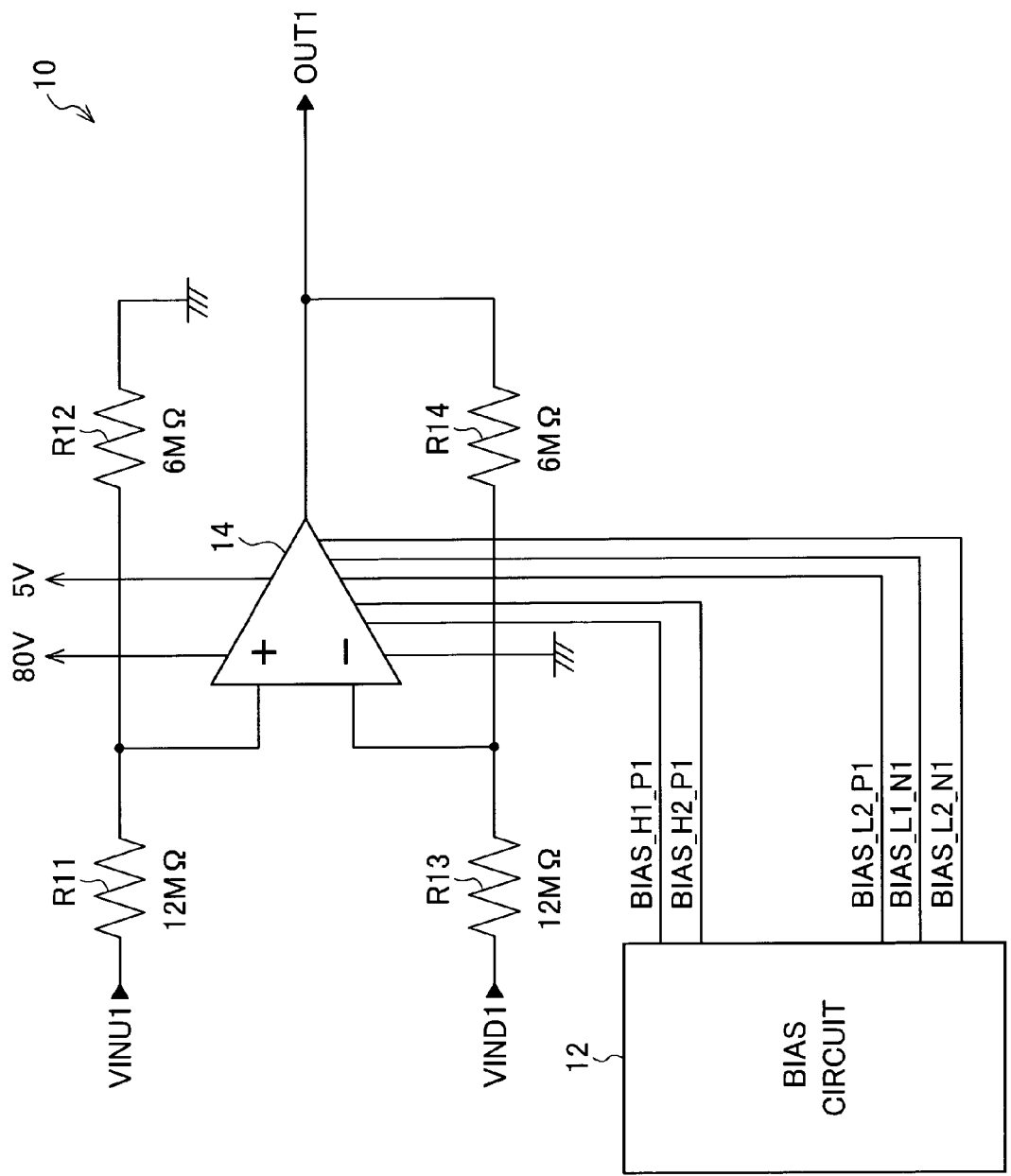
FIG. 1 is a simple schematic circuit diagram of a novel semiconductor device including a differential amplifier and its bias circuit.

Embodiments of the invention will now be described with reference to the attached drawings, in which like elements are indicated by like reference characters. The description will refer to high-voltage and low-voltage p-channel metal-oxide-semiconductor (PMOS) and n-channel metal-oxide-semiconductor (NMOS) transistors. The terms high-voltage and low-voltage are relative, meaning that a high-voltage transistor is able to withstand source-drain, gate-drain, and source-gate voltages that would cause breakdown in a low-voltage transistor. In the drawings, HVMOS is used to designate high-voltage MOS transistors and LVMOS is used to designate low-voltage MOS transistors.

Folded cascode differential amplifiers will sometimes be referred to simply as differential amplifiers.

First Embodiment

Referring to FIG. 1, a first embodiment of the invention is a semiconductor device 10 including a bias circuit 12, a folded cascode differential amplifier 14, and resistors R11, R12, R13, R14. Exemplary resistance values of the resistors are twelve megohms (12 MΩ) for R11 and R13, and 6 MΩ for R12 and R14.

An input voltage VINU1 is supplied through resistor R11 to a node connected to the non-inverting input terminal of the differential amplifier 14 and, through resistor R12, to ground. An input voltage VIND1 is supplied through resistor R13 to a node connected to the inverting input terminal of the differential amplifier 14 and, through resistor R14, to the output terminal of the differential amplifier 14. With the exemplary resistance values shown, these connections force the differential amplifier 14 to generate an output voltage OUT1 equal to half the difference between VINU1 and VIND1. For example, if VINU1 exceeds VIND1 by six volts (6 V), the output voltage OUT1 is 3 V with respect to ground.

The differential amplifier 14 operates on two power supply voltages: 80 V and 5 V. The bias circuit 12 supplies the differential amplifier 14 with five bias voltages BIAS_H1_P1, BIAS_H2_P1, BIAS_L2_P1, BIAS_L1_N1, BIAS_L2_N1.

Figure 2:
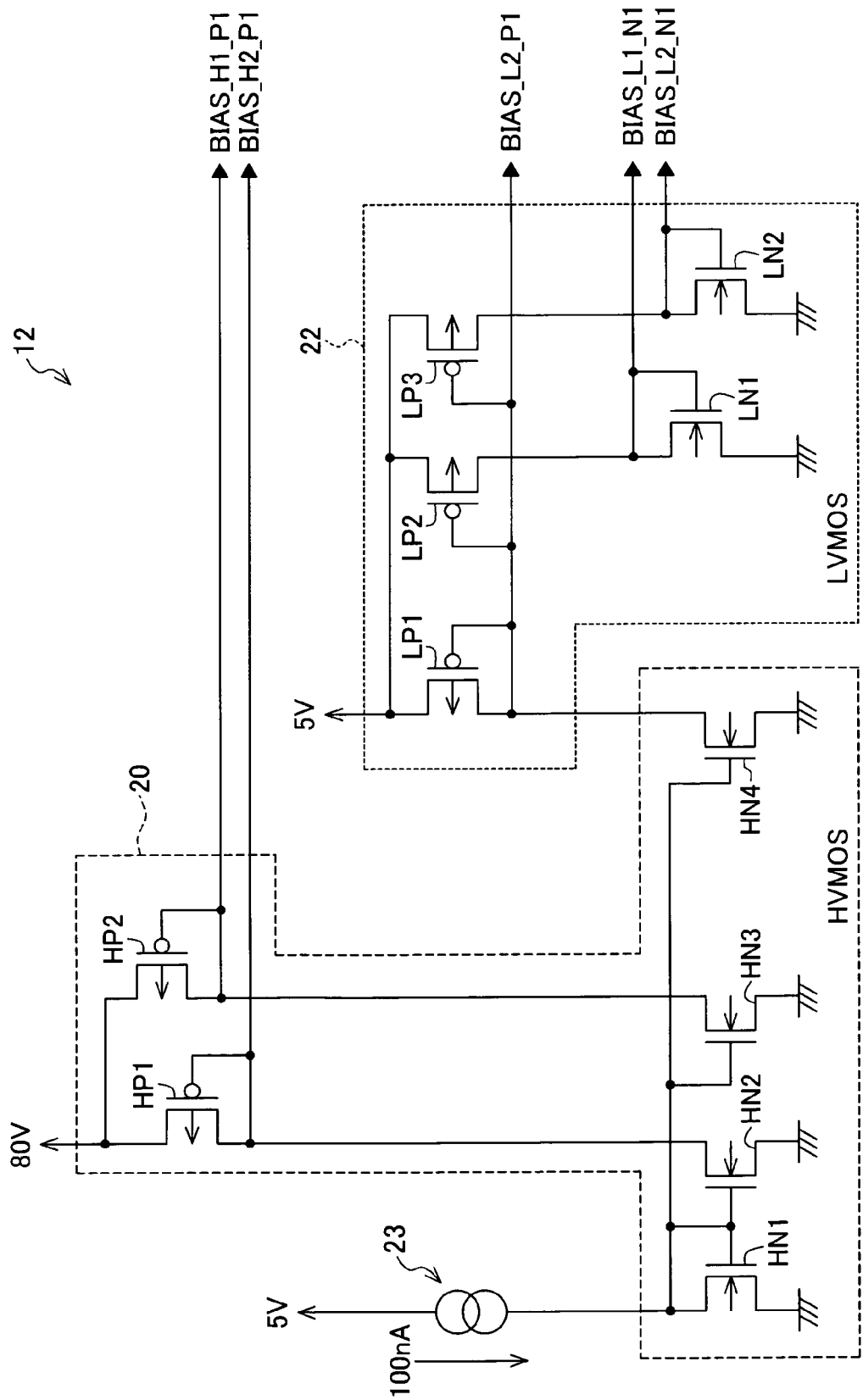
FIG. 2 is a schematic circuit diagram of the bias circuit in FIG. 1 in a first embodiment of the invention.

Referring to FIG. 2, the bias circuit 12 has a high-voltage (HVMOS) section 20, a low-voltage (LVMOS) section 22, and a constant current source 23. The constant current source 23 generates a constant one-hundred nanoampere (100 nA) current from the 5-V power supply. The high-voltage section 20 is configured as a current mirror circuit that uses the 100-nA current and the 80-V power supply to generate bias voltages BIAS_H1_P1 and BIAS_H2_P1. The high-voltage section 20 also supplies a current to the low-voltage section 22. The low-voltage section 22, which is likewise configured as a current mirror, uses the supplied current and the 5-V power supply to generate bias voltages BIAS_L2_P1, BIAS_L1_N1, and BIAS_L2_N1.

The high-voltage section 20 includes high-voltage PMOS transistors HP1, HP2 and high-voltage NMOS transistors HN1, HN2, HN3, HN4. The source terminals of the PMOS transistors HP1, HP2 are connected to the 80-V power supply. The source terminals of the NMOS transistors HN1, HN2, HN3, HN4 are connected to ground. The drain terminal of transistor HN1 receives the 100-nA current from the constant current source 23. The gate terminals of transistors HN1, HN2, HN3, HN4 are all connected to the drain terminal of transistor HN1, so that transistors HN2, HN3, and HN4 conduct currents that mirror the 100-nA current conducted by transistor HN1. The drain terminal of transistor HN2 is connected to the drain and gate terminals of transistor HP1 at a node from which bias voltage BIAS_H2_P1 is taken. The drain terminal of transistor HN3 is connected to the drain and gate terminals of transistor HP2 at a node from which bias voltage BIAS_H1_P1 is taken.

The low-voltage section 22 includes low-voltage PMOS transistors LP1, LP2, LP3 and low-voltage NMOS transistors LN1, LN2. The source terminals of the PMOS transistors LP1, LP2, LP3 are connected to the 5-V power supply. The source terminals of the NMOS transistors LN1, LN2 are connected to ground. The drain terminal of transistor LP1 is connected to the drain terminal of high-voltage NMOS transistor HN4 in the high-voltage section 20. The gate terminals of transistors LP1, LP2, LP3 are all connected to the drain terminal of transistor LP1 at a node from which bias voltage BIAS_L2_P1 is taken. Transistors LP2 and LP3 conduct currents that mirror the current conducted by transistors LP1 and HN1, which in turn mirrors the 100-nA current output by the constant current source 23. The drain terminal of transistor LP2 is connected to the drain and gate terminals of transistor LN1 at a node from which bias voltage BIAS_L1_N1 is taken. The drain terminal of transistor LP3 is connected to the drain and gate terminals of transistor LN2 at a node from which bias voltage BIAS_L2_N1 is taken.

Figure 3:
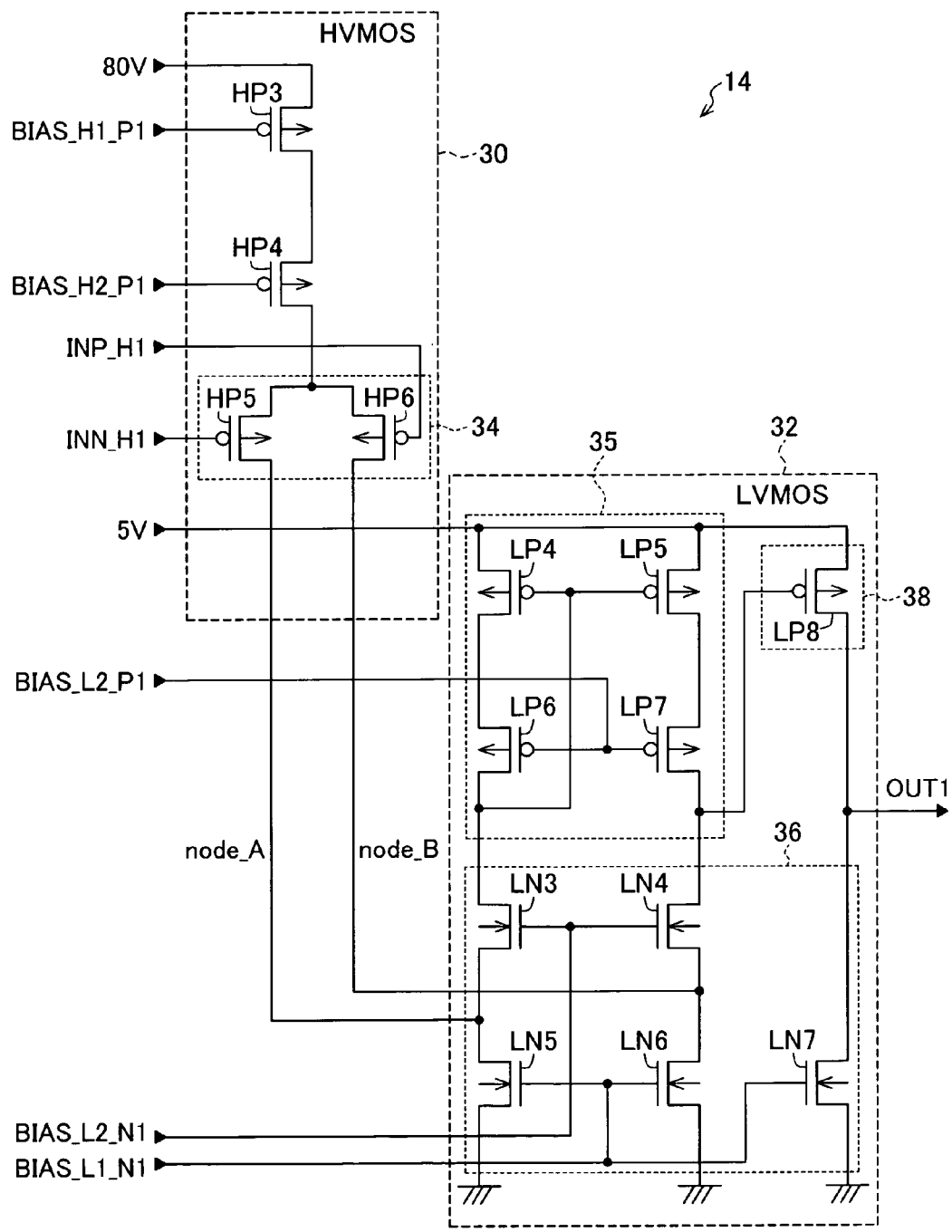
FIG. 3 is a schematic circuit diagram of the differential amplifier in FIG. 1 in the first embodiment.

Referring to FIG. 3, the differential amplifier 14 has a folded cascode configuration including an input stage 30 and an output stage 32. The input stage 30 includes a differential pair 34 that detects the difference between input voltages INP_H1 and INN_H1. The output stage 32 includes a current mirror section 35, a constant current source section 36, and an amplifying section 38. The current mirror section 35 and constant current source section 36 form a single current mirror circuit.

The input stage 30 includes high-voltage PMOS transistors HP3, HP4, HP5, HP6. Transistors HP3 and HP4 are connected in a cascode configuration: the source terminal of transistor HP3 is connected to the 80-V power supply; the gate terminal of transistor HP3 receives bias voltage BIAS_H1_P1; the drain terminal of transistor HP3 is connected to the source terminal of transistor HP4; the gate terminal of transistor HP3 receives bias voltage BIAS_H2_P1; the drain terminal of transistor HP3 is connected to the source terminals of transistors HP5 and HP6, which form the differential pair 34. An input voltage INN_H1 is supplied to the gate terminal of transistor HP5, which forms the inverting input terminal of the differential amplifier 14. An input voltage INP_H1 is supplied to the gate terminal of transistor HP6, which forms the non-inverting input terminal of the differential amplifier 14. The drain terminals of transistors HP5 and HP6 are connected to the constant current source section 36 in the output stage 32 by interconnecting lines denoted node_A and node_B.

The output stage 32 includes low-voltage PMOS transistors LP4, LP5, LP6, LP7 forming the current mirror section 35, low-voltage NMOS transistors LN3, LN4, LN5, LN6, LN7 forming the constant current source section 36, and a single low-voltage PMOS transistor LP8 forming the amplifying section 38. The 5-V supply voltage is supplied to the source terminals of PMOS transistors LP4, LP5, LP8. The source terminals of NMOS transistors LN5, LN6, LN7 are connected to ground. Transistors LP4, LP6, LN3, LN5 are connected in series in this order between the 5-V power supply and ground. Similarly, transistors LP5, LP7, LN4, LN6 are connected in series in this order between the 5-V power supply and ground. Transistors LP8 and LN7 are also connected in series between the 5-V power supply and ground, their drain terminals both being connected to the output node of the folded cascode differential amplifier 14, from which the output voltage OUT1 is taken. The gate terminals of transistors LP4 and LP5 are connected to the drain terminal of transistor LP6. The gate terminals of transistors LP6 and LP7 receive bias voltage BIAS_L2_P1. The gate terminals of transistors LN3 and LN4 receive bias voltage BIAS_L2_N1. The gate terminals of transistors LN5, LN6, and LN7 receive bias voltage BIAS_L1_N1. The gate terminal of transistor LP8 is connected to the drain terminal of transistor LP7.

Node_A and node_B are connected to intermediate points in the constant current source section 36. Specifically, node_A is connected to the source of transistor LN3 and the drain of transistor LN5, and node_B is connected to the source of transistor LN4 and the drain of transistor LN6. The voltages at node_A and node_B are therefore both kept relatively low. For example, when the difference between the input voltages INP_H1 and INN_H1 is 6 V, the voltages at node_A and node_B are less than about 0.3 V. The interconnections between the high-voltage input stage 30 and low-voltage output stage 32 accordingly pose no risk of voltage breakdown in the output stage 32.

The circuits in FIGS. 2 and 3 require a total of twenty-five transistors, of which ten are high-voltage transistors. Only four of the high-voltage transistors are disposed in the folded cascode differential amplifier 14, all in the input stage 30.

The bias circuit 12 has to generate only five bias voltages, and requires only six high-voltage transistors.

These resistor counts compare quite favorably with the resistor counts of the conventional differential amplifier circuit and bias circuit described below.

The theory of operation of folded cascode differential amplifiers and bias circuits of the general type shown in FIGS. 2 and 3 is well known, so a detailed description of the operation will be omitted.

Second Embodiment

The second embodiment differs from the first embodiment in the internal circuit configuration of the folded cascode differential amplifier and the bias circuit.

Figure 4:
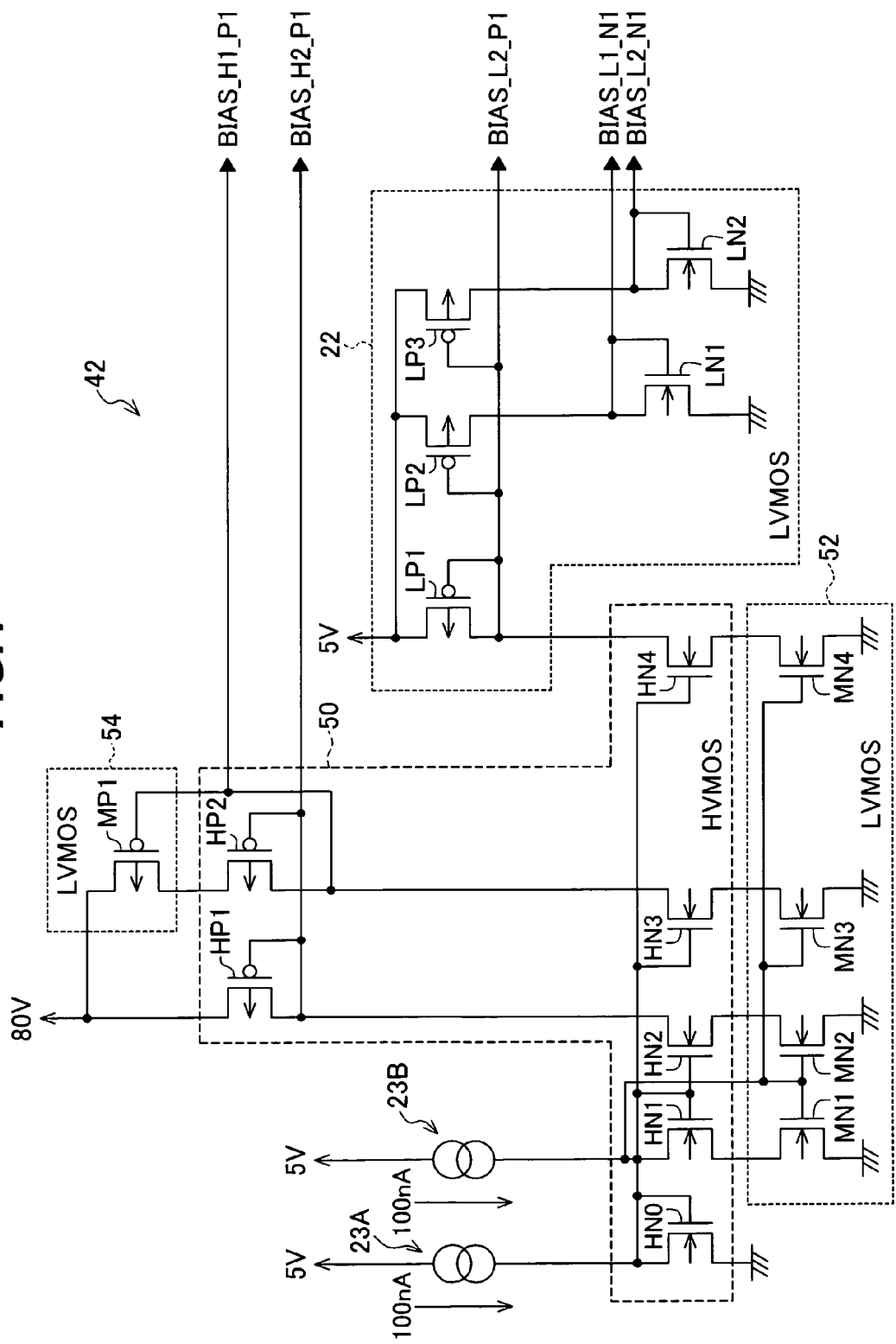
FIG. 4 is a schematic circuit diagram of the bias circuit in FIG. 1 in a second embodiment of the invention.

Referring to FIG. 4, the bias circuit 42 in the second embodiment includes the same low-voltage section 22 as in the first embodiment but has a different high-voltage section 50, an additional low-voltage mirror section 52, an additional low-voltage cascode section 54, and two constant current sources 23A, 23B instead of one.

The high-voltage section 50 includes the same transistors HP1, HP2, HN1, HN2, HN3, HN4 as in the first embodiment, interconnected in the same way except that the gate terminal of transistor HP2 is connected to the drain terminal of transistor HP1 instead of to the drain terminal of transistor HP2. In addition, the high-voltage section 50 has another high-voltage NMOS transistor HN0. Transistor HN0 has its source terminal connected to ground and its gate terminal connected to its drain terminal, which receives a 100-nA current from constant current source 23A. The gate and drain terminals of transistor HN0 are also connected to the drain terminal of transistor HN1, which receives a 100-nA current from constant current source 23B.

The low-voltage mirror section 52 includes NMOS transistors MN1, MN2, MN3, MN4 that form a current mirror connected in cascode with the current mirror in the high-voltage section 50. The source terminals of NMOS transistors MN1, MN2, MN3, MN4 are connected to ground, their gate terminals are connected to the drain terminal of transistor HN1, and their drain terminals are connected to the source terminals of the corresponding high-voltage NMOS transistors HN1, HN2, HN3, HN4.

The low-voltage cascode section 54 includes a single low-voltage PMOS transistor MP1 that is connected in cascode with high-voltage PMOS transistor HP2. This cascode PMOS transistor MP1 has its source terminal connected to the 80-V power supply, its gate terminal connected to the drain terminal of transistor HP2, and its drain terminal connected to the source terminal of transistor HP2. Bias voltage BIAS_H1_P1 is taken from the drain of transistor HP2 as in the first embodiment.

Figure 5:
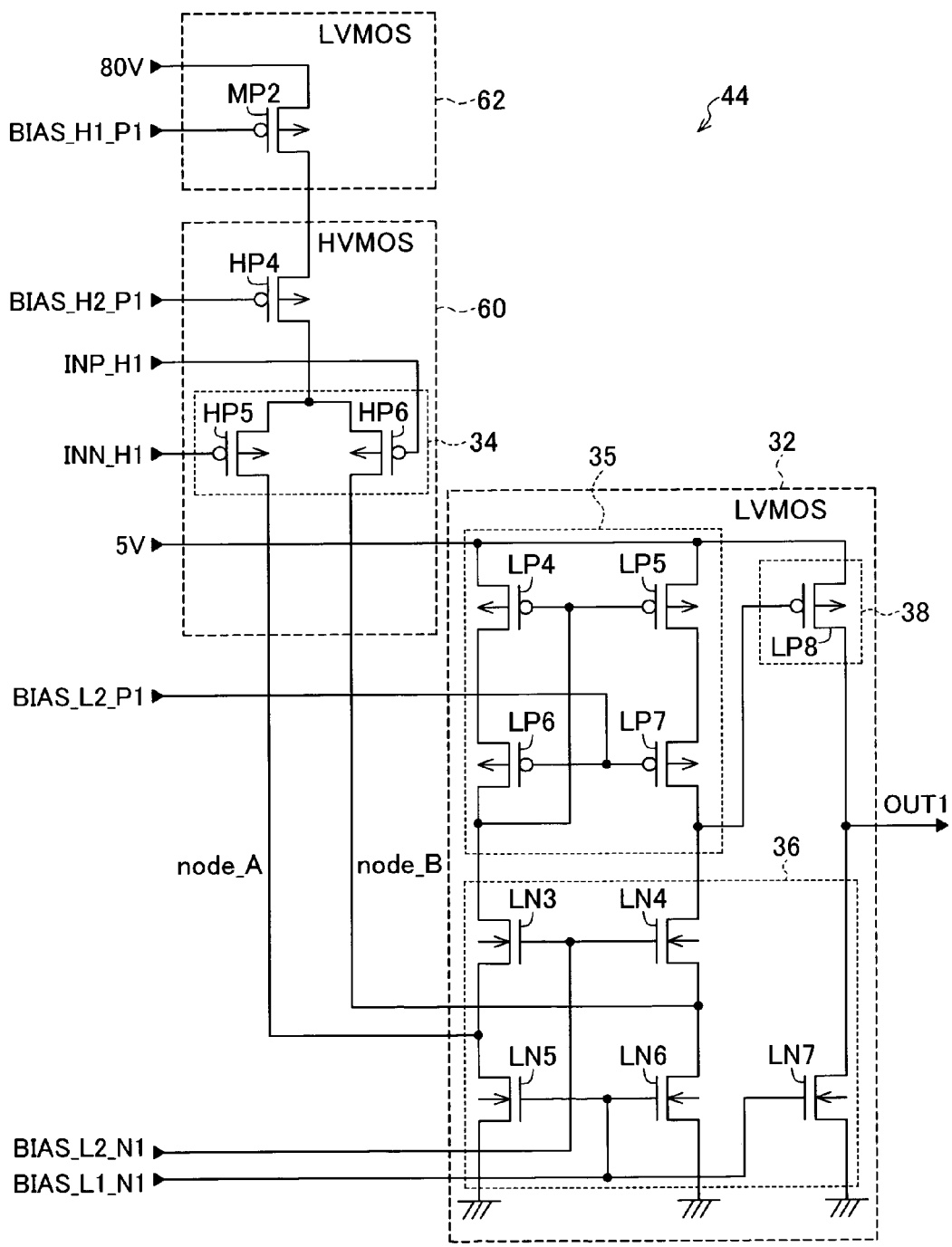
FIG. 5 is a schematic circuit diagram of the differential amplifier in FIG. 1 in the second embodiment.

Referring to FIG. 5, the folded cascode differential amplifier 44 in the second embodiment has the same output stage 32 as in the first embodiment, a modified input stage 60, and an additional low-voltage cascode section 62. The low-voltage cascode section 62 includes a low-voltage PMOS transistor MP2 that replaces high-voltage PMOS transistor HP3 in the first embodiment. Transistor MP2 has its source connected to the 80-V power supply and its drain connected to the source terminal of transistor HP4, and receives bias voltage BIAS_H1_P1 at its gate terminal.

Aside from the replacement of high-voltage PMOS transistor HP3 by low-voltage PMOS transistor MP2, the input stage 60 is identical to the input stage in the first embodiment.

The cascode connections of the additional low-voltage transistors MP1, MP2, MN1, MN2, MN3, MN4 ensure that their source-drain, gate-drain, and gate-source voltages do not greatly exceed their threshold voltages. Accordingly, voltage breakdown does not occur, even though these transistors are on current paths leading from the 80-V power supply to ground.

The second embodiment operates in the same way as the first embodiment (details omitted).

The substitution of low-voltage transistor PMOS transistor MP2 for high-voltage PMOS transistor HP3 in the second embodiment reduces the layout space of the differential amplifier 44, and improves the offset characteristic of the differential amplifier 44 by improving the accuracy of the current mirror circuit in the output stage 32.

The additional low-voltage transistors added to the bias circuit 42 in the second embodiment improve the accuracy of the bias voltages, without requiring as much layout space as would be necessary if high-voltage cascode transistors were used.

The breakdown voltage of low-voltage transistor MP2 in the differential amplifier 44 in the second embodiment is preferably the same as the breakdown voltages of the transistors in the output stage 32. Similarly, the breakdown voltages of the additional low-voltage transistors MP1, MN1, MN2, MN3, MN4 in the bias circuit 42 are preferably the same as the breakdown voltages of the transistors in the low-voltage section 22. If necessary, however, transistors with higher breakdown voltages may be used in the low-voltage mirror section 52 and low-voltage cascode sections 54, 62, provided these breakdown voltages are lower than the breakdown voltages of the high-voltage transistors.

For comparison, the above-mentioned conventional circuit with two folded cascode differential amplifiers will now be described.

Figure 6:
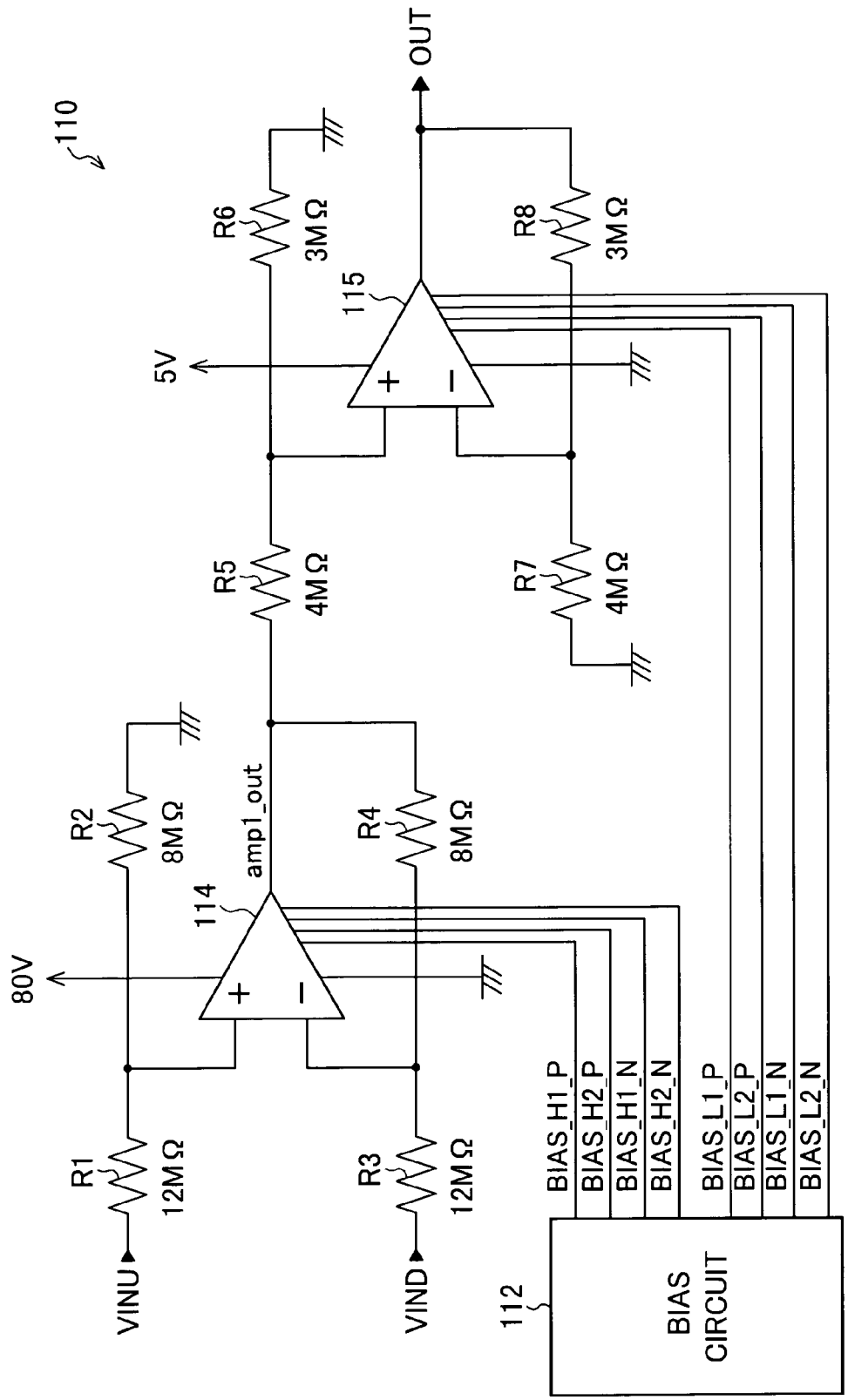
FIG. 6 is a simple schematic circuit diagram of a conventional semiconductor device including two differential amplifiers and their bias circuit.

Referring to FIG. 6, the conventional differential amplifier 110 includes a bias circuit 112, resistors R1 to R8, a high-voltage differential amplifier 114 operating on an 80-V power supply, and a low-voltage differential amplifier 115 operating on a 5-V power supply. The low-voltage differential amplifier 115 consists entirely of low-voltage transistors, the high-voltage differential amplifier 114 consists entirely of high-voltage transistors, and the bias circuit 112 includes both high-voltage and low-voltage transistors. The bias circuit 112 supplies four bias voltages BIAS_H1_P, BIAS_H2_P, BIAS_H1_N, BIAS_H2_N to the high-voltage differential amplifier 114 and four bias voltages BIAS_L1_P, BIAS_L2_P, BIAS_L1_N, BIAS_L2_N to the low-voltage differential amplifier 115.

Figure 7:
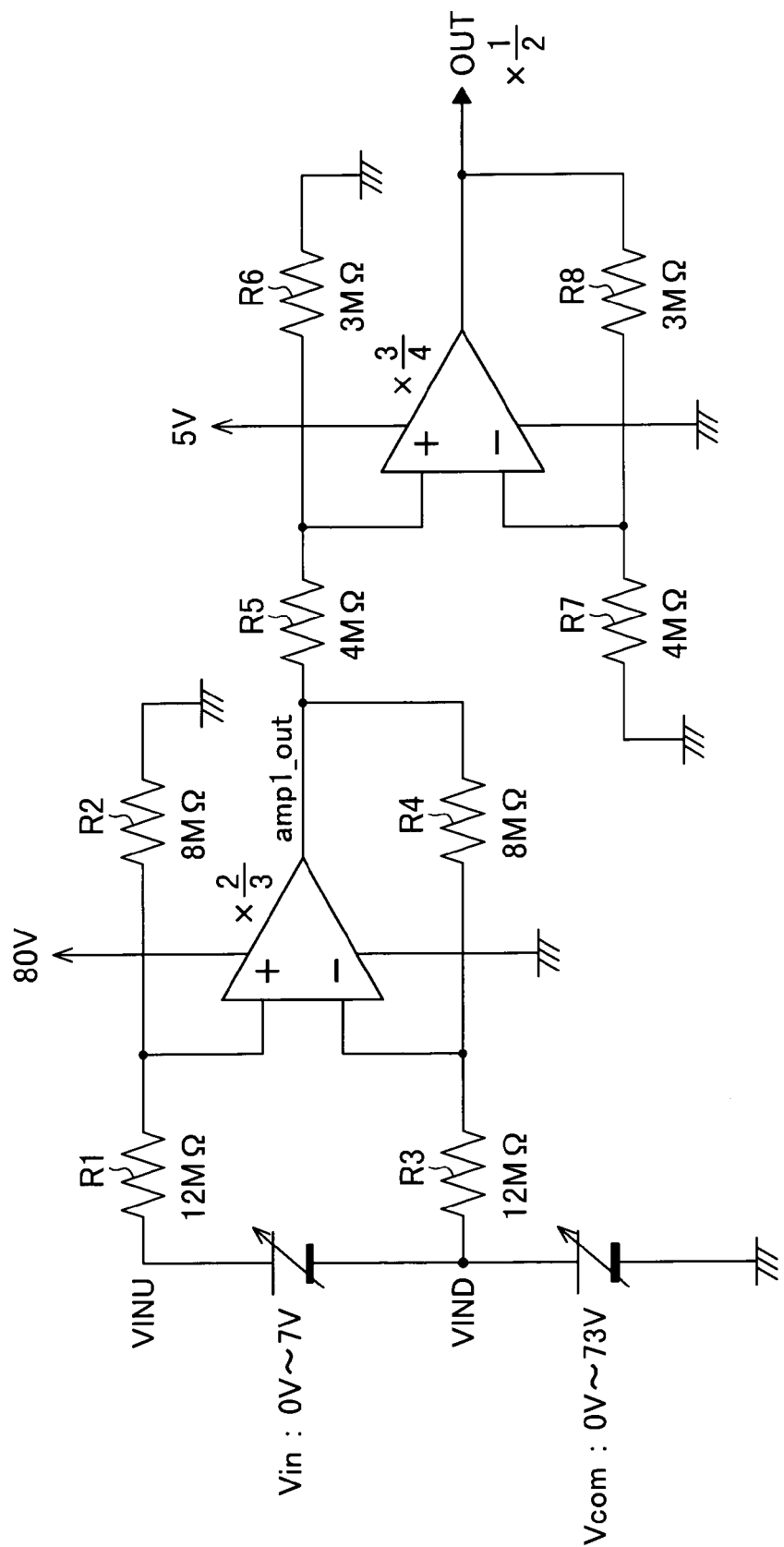
FIG. 7 is a simple schematic circuit diagram indicating the ranges of the input voltages to the first differential amplifier in FIG. 6.

As in the embodiments described above, this conventional circuit receives a pair of input voltages VINU and VIND and generates an output voltage-equal to half their difference. FIG. 7 represents the source of the input voltages VINU, VIND as a pair of variable voltage sources, one of which generates a differential voltage Vin of from 0 V to 7 V, the other of which generates a common-mode voltage Vcom of from 0 to 73 V. These voltage sources are connected so that Vcom is the voltage between the VIND input terminal and ground and Vin is the voltage between the VINU and VIND input terminals.

Resistors R1-R4 are connected to the high-voltage differential amplifier 114, and resistors R5-R8 to the low-voltage differential amplifier 115, in the configuration described in the first embodiment. The output amp1_out of the high-voltage differential amplifier 114 is supplied through resistor R5 to the non-inverting input terminal of the low-voltage differential amplifier 115. The inverting input terminal of the low-voltage differential amplifier 115 is connected through resistor R7 to ground. The resistance values are 12 MΩ for R1 and R3, 8 MΩ for R2 and R4, 4 MΩ for R5 and R7, and 3 MΩ for R6 and R8. These resistance values cause differential amplifier 114 to operate with ⅔ gain (⁸⁄₁₂ gain) and differential amplifier 115 to operate with ¾ gain, so that the output voltage (OUT) is equal to the differential input voltage Vin multiplied by ½.

Figure 8:
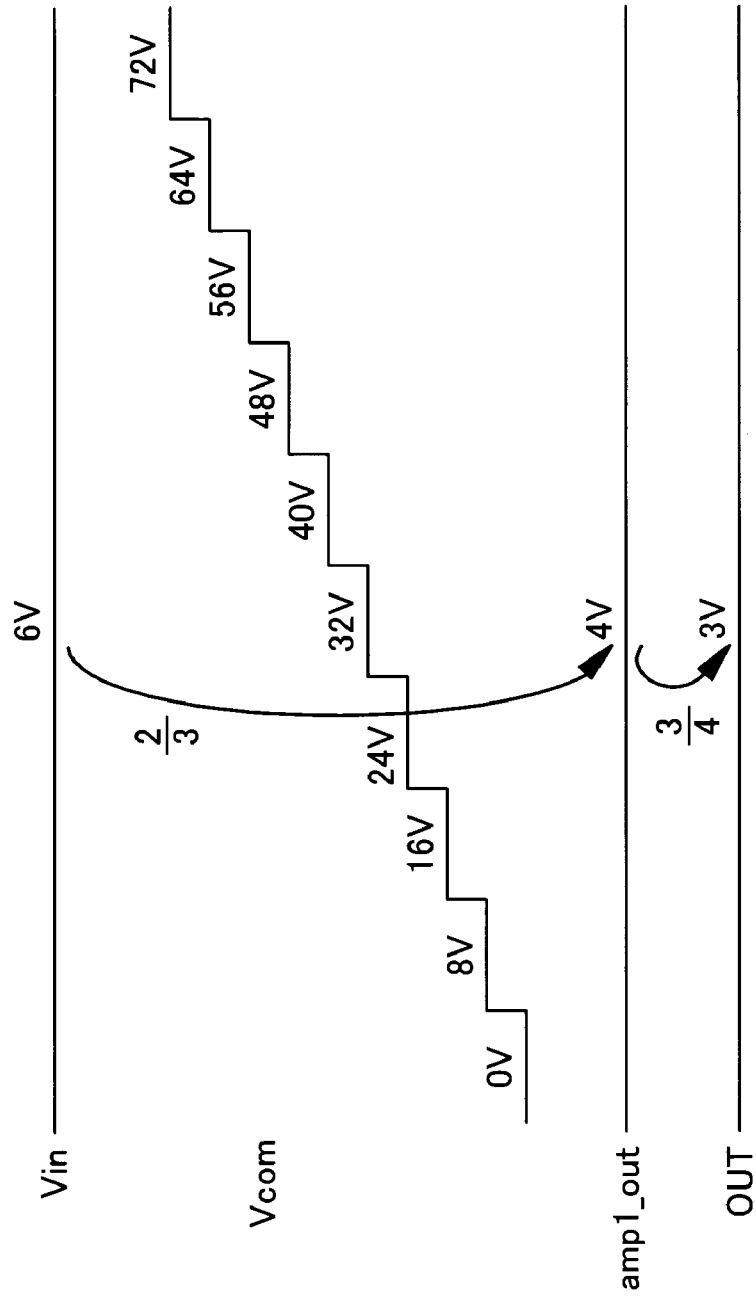
FIG. 8 is a graph showing exemplary input and output voltages in FIG. 6.

The two-stage amplification process is illustrated in FIG. 8 for the case in which the differential input voltage Vin is 6 V. As the common-mode input voltage Vcom is stepped from 0 V to 72 V, the high-voltage differential amplifier 114 consistently produces an output voltage (amp1_out) of 4 V, and the low-voltage differential amplifier 115 consistently produces an output voltage (OUT) of 3 V.

Figure 9:
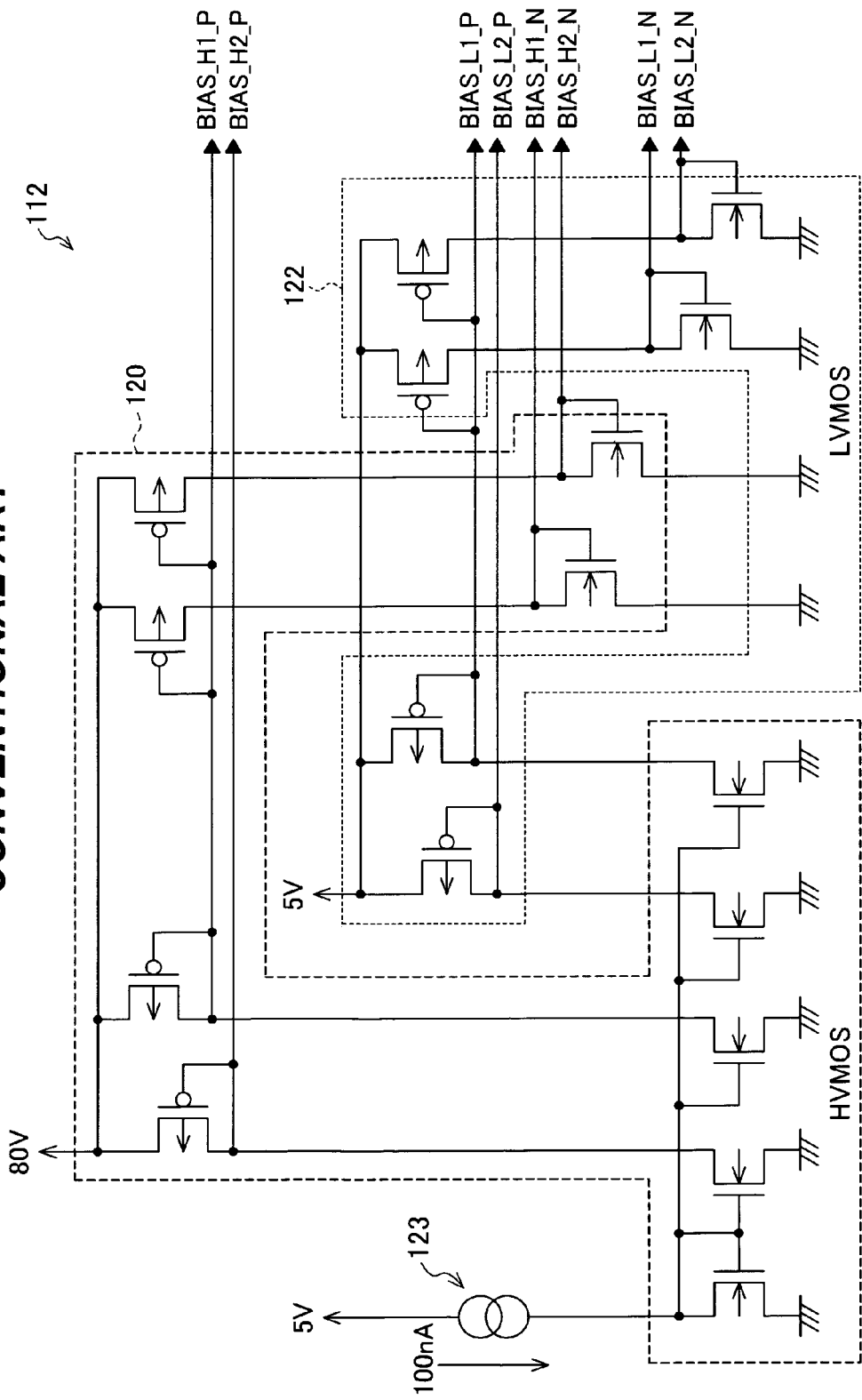
FIG. 9 is a schematic circuit diagram of the bias circuit in FIG. 6.

Referring to FIG. 9, the conventional bias circuit 112 includes a constant current source 123 that generates a 100-nA current, a high-voltage section 120 that operates on the 80-V power supply, and a low-voltage section 122 that operates on the 5-V power supply. The circuit configurations of the high-voltage section 120 and low-voltage section 122 are generally similar to the circuit configurations of the high-voltage section 20 and low-voltage section 22 in the first embodiment, but since eight bias voltages must be generated, more transistors are required. The high-voltage section 120 includes six high-voltage PMOS transistors and five high-voltage NMOS transistors. The low-voltage section 122 includes four low-voltage PMOS transistors and two low-voltage NMOS transistors.

Figure 10:
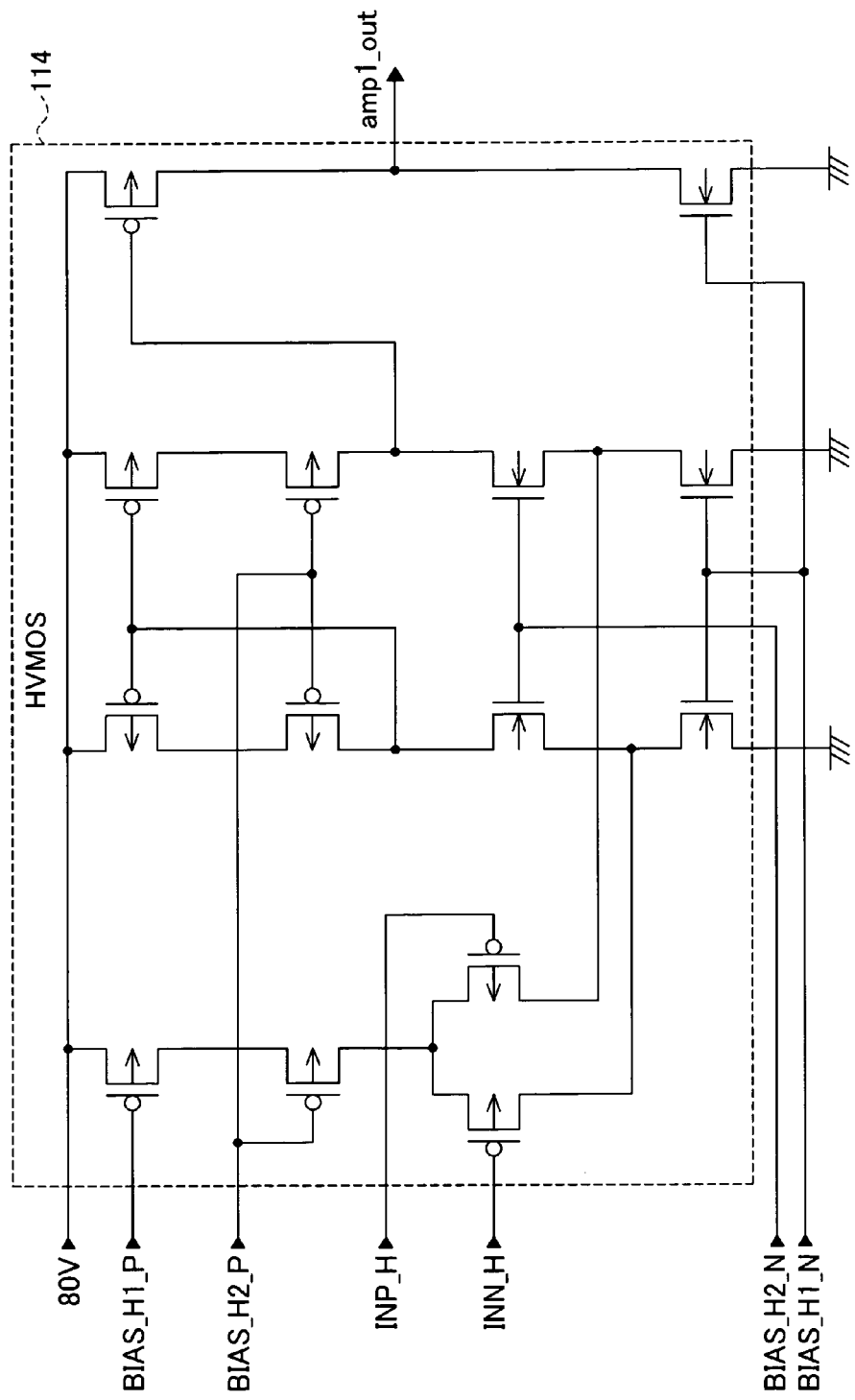
FIG. 10 is a schematic circuit diagram of the high-voltage differential amplifier in FIG. 6.

Referring to FIG. 10, the high-voltage differential amplifier 114 has the same folded cascode circuit configuration as the differential amplifier 14 in the first embodiment except that since all of its constituent transistors are high-voltage transistors, only four bias voltages are necessary. In all, the high-voltage differential amplifier 114 includes nine high-voltage PMOS transistors and five high-voltage NMOS transistors.

Figure 11:
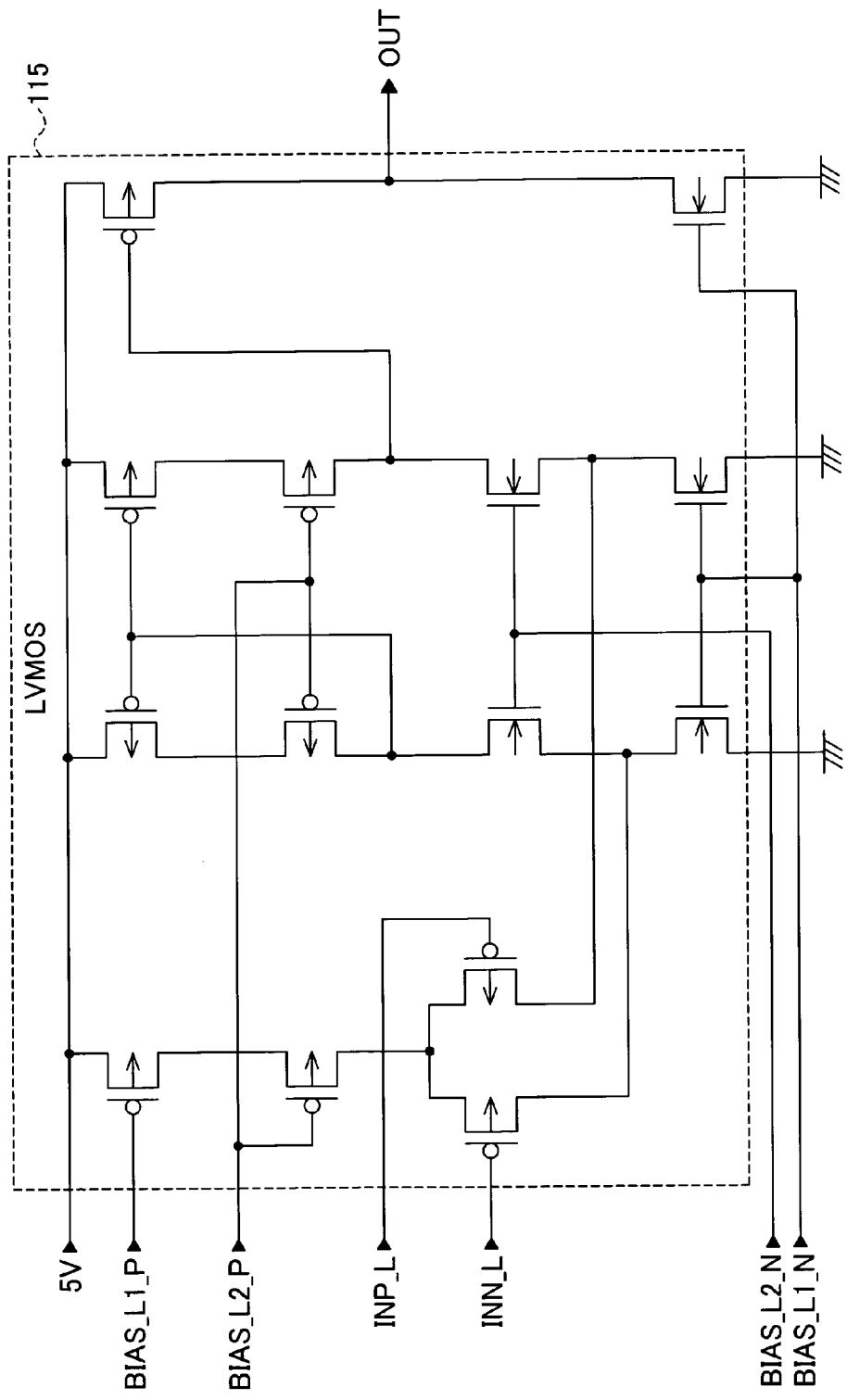
FIG. 11 is a schematic circuit diagram of the low-voltage differential amplifier in FIG. 6.

Referring to FIG. 11, the low-voltage differential amplifier 115 has the same circuit configuration as the high-voltage differential amplifier 114 except that all of its constituent transistors are low-voltage transistors. Four more bias voltages are necessary.

Taken together, the circuits in FIGS. 9 to 11 include a total of twenty-five high-voltage transistors and twenty low-voltage transistors. This is considerably more than the total of ten high-voltage transistors and fifteen low-voltage transistors used by the bias circuit 12 and differential amplifier 14 in the first embodiment, and also compares unfavorably with the ten high-voltage transistors and twenty-one low-voltage transistors found in the second embodiment. In particular, the use of more than twice as many high-voltage transistors makes the conventional differential amplifier 110 much larger than the differential amplifier 10 in the first and second embodiments.

A further advantage of the circuits in the first and second embodiments is that they require only half as many resistors as the conventional circuit. Besides saving space, this reduction in the resistor count improves the precision of the output voltage by reducing opportunities for resistance value error.

The reduced number of transistors also improves the precision of the output, by reducing the likelihood of error due to mismatched transistor characteristics.

The invention is not limited to the embodiments described above. Those skilled in the art will recognize that numerous variations are possible within the scope of the invention, which is defined in the appended claims.

What is claimed is:

1. A folded cascode differential amplifier powered by a first power supply supplying a first power supply voltage and a second power supply supplying second power supply voltage lower than the first power supply voltage, comprising:
   an input stage powered by the first power supply, the input stage including a first plurality of MOS transistors, two of which form a differential pair for receiving respective input voltage signals; and
   an output stage powered by the second power supply, the output stage including a second plurality of MOS transistors, some of which form a first current mirror circuit connected to both transistors of the differential pair, the second plurality of MOS transistors also including at least one transistor forming an amplifying stage that amplifies a voltage produced in the first current mirror circuit to generate an output voltage signal,
   wherein the first plurality of MOS transistors have higher breakdown voltages than the second plurality of MOS transistors.

2. A folded cascode differential amplifier powered by a first power supply supplying a first power supply voltage and a second power supply supplying second power supply voltage lower than the first power supply voltage, comprising:
   an input stage powered by the first power supply, the input stage including a first plurality of MOS transistors, two of which form a differential pair for receiving respective input voltage signals; and
   an output stage powered by the second power supply, the output stage including a second plurality of MOS transistors, some of which form a first current mirror circuit connected to the differential pair, the second plurality of MOS transistors also including at least one transistor forming an amplifying stage that amplifies a voltage produced in the first current mirror circuit to generate an output voltage signal,
   wherein the first plurality of MOS transistors have higher breakdown voltages than the second plurality of MOS transistors, and
   wherein the first current mirror circuit further comprises:
      a first pair of NMOS transistors having grounded source terminals, identically biased gate terminals, and respective drain terminals connected to respective drain terminals of the two transistors forming the differential pair; and
      a second pair of NMOS transistors having respective source terminals connected to the respective drain terminals of the first pair of NMOS transistors.

3. The folded cascode differential amplifier of claim 1, further comprising a first cascode MOS transistor connected between the first power supply and the differential pair, the first cascode MOS transistor having a breakdown voltage lower than the breakdown voltages of the first plurality of MOS transistors.

4. The folded cascode differential amplifier of claim 3, wherein the first plurality of MOS transistors further includes a transistor connected in series between the first cascode MOS transistor and the differential pair.

5. The folded cascode differential amplifier of claim 3, wherein the first cascode MOS transistor and the second plurality of MOS transistors have mutually identical breakdown voltages.

6. A semiconductor device, comprising:
   a folded cascode differential amplifier powered by a first power supply supplying a first power supply voltage and a second power supply supplying second power supply voltage lower than the first power supply voltage, the folded cascode differential amplifier comprising:
   an input stage powered by the first power supply, the input stage including a first plurality of MOS transistors, two of which form a differential pair for receiving respective input voltage signals; and
   an output stage powered by the second power supply, the output stage including a second plurality of MOS transistors, some of which form a first current mirror circuit connected to the differential pair, the second plurality of MOS transistors also including at least one transistor forming an amplifying stage that amplifies a voltage produced in the first current minor circuit to generate an output voltage signal, and
a bias circuit, the bias circuit comprising:
   a first constant current source for generating a first constant current;
   a third plurality of MOS transistors forming a second current mirror circuit,
   a fourth plurality of MOS transistors forming a third current minor circuit,
wherein the first plurality of MOS transistors in the folded cascode differential amplifier have higher breakdown voltages than the second plurality of MOS transistors,
wherein the second current mirror circuit is powered by the first power supply, receives the first constant current from the first constant current source, and supplies a bias voltage to the input stage of the folded cascode differential amplifier,
wherein the third current minor circuit is powered by the second power supply, is connected to the second current minor circuit, and supplies a bias voltage to the output stage of the folded cascode differential amplifier, and
wherein the third plurality of MOS transistors have higher breakdown voltages than the fourth plurality of MOS transistors.

7. The semiconductor device of claim 6, wherein:
the second current mirror circuit includes first and second high-voltage PMOS transistors and first to fourth high-voltage NMOS transistors having respective source, gate, and drain terminals;
the third current minor circuit includes first to third low-voltage PMOS transistors and first and second low-voltage NMOS transistors having respective source, gate, and drain terminals;
the source terminals of the first and second high-voltage PMOS transistors are connected to the first power supply;
the source terminals of the first, second, and third low-voltage PMOS transistors are connected to the second power supply;
the source terminals of the first, second, third, and fourth high-voltage NMOS transistors and the source terminals of the first and second low-voltage NMOS transistors are connected to ground;
the drain terminal of the first high-voltage NMOS transistor is connected to the first constant current source to receive the first constant current;
the drain terminals of the first high-voltage PMOS transistor and the second high-voltage NMOS transistor are mutually interconnected;
the drain terminals of the second high-voltage PMOS transistor and the third high-voltage NMOS transistor are mutually interconnected;
the drain terminals of the first low-voltage PMOS transistor and the fourth high-voltage NMOS transistor are mutually interconnected;
the drain terminals of the second low-voltage PMOS transistor and the first low-voltage NMOS transistor are mutually interconnected;
the drain terminals of the third low-voltage PMOS transistor and the second low-voltage NMOS transistor are mutually interconnected;
the gate and drain terminals of the first high-voltage PMOS transistor are mutually interconnected;
the gate and drain terminals of the second high-voltage PMOS transistor are mutually interconnected;
the gate terminals of the first, second, third, and fourth high-voltage NMOS transistors are connected to the drain terminal of the first high-voltage NMOS transistor;
the gate terminals of the first, second, and third low-voltage PMOS transistors are connected to the drain terminal of the first low-voltage PMOS transistor;
the gate and drain terminals of the first low-voltage NMOS transistor are mutually interconnected;
the gate and drain terminals of the second low-voltage NMOS transistor are mutually interconnected;
a first bias voltage is output from the drain terminal of the second high-voltage PMOS transistor;
a second bias voltage is output from the drain terminal of the first high-voltage PMOS transistor;
a third bias voltage is output from the drain terminal of the first low-voltage PMOS transistor;
a fourth bias voltage is output from the drain terminal of the first low-voltage NMOS transistor; and
a fifth bias voltage is output from the drain terminal of the second low-voltage NMOS transistor.

8. The semiconductor device of claim 7, wherein:
the input stage of the folded cascode differential amplifier includes third to sixth high-voltage PMOS transistors having respective source, gate, and drain terminals, the fifth and sixth high-voltage PMOS transistors constituting the differential pair;
the first current mirror circuit includes fourth to eighth low-voltage PMOS transistors and third to seventh low-voltage NMOS transistors having respective source, gate, and drain terminals;
the source terminal of the third high-voltage PMOS transistor is connected to the first power supply;
the source terminals of the fourth, fifth, and eighth low-voltage PMOS transistors are connected to the second power supply;
the drain terminal of the third high-voltage PMOS transistor is connected to the source terminal of the fourth high-voltage PMOS transistor;
the drain terminal of the fourth high-voltage PMOS transistor is connected to the source terminals of the fifth and sixth high-voltage PMOS transistors;
the drain terminal of the fourth low-voltage PMOS transistor is connected to the source terminal of the sixth low-voltage PMOS transistor;
the drain terminals of the sixth low-voltage PMOS transistor and the third low-voltage NMOS transistor are mutually interconnected;
the source terminal of the third low-voltage NMOS transistor is connected to the drain terminals of the fifth high-voltage PMOS transistor and the fifth low-voltage NMOS transistor;
the drain terminal of the fifth low-voltage PMOS transistor is connected to the source terminal of the seventh low-voltage PMOS transistor;

the drain terminals of the seventh low-voltage PMOS transistor and the fourth low-voltage NMOS transistor are mutually interconnected;
the source terminal of the fourth low-voltage NMOS transistor is connected to the drain terminals of the sixth high-voltage PMOS transistor and the sixth low-voltage NMOS transistor;
the drain terminals of the eighth low-voltage PMOS transistor and the seventh low-voltage NMOS transistor are mutually interconnected;
the gate terminal of the third high-voltage PMOS transistor receives the first bias voltage;
the gate terminal of the fourth high-voltage PMOS transistor receives the second bias voltage;
the gate terminals of the fifth and sixth high-voltage PMOS transistors receive the respective input voltage signals;
the gate terminals of the fourth and fifth low-voltage PMOS transistors are connected to the drain terminal of the sixth low-voltage PMOS transistor;
the gate terminals of the sixth and seventh low-voltage PMOS transistors receive the third bias voltage;
the gate terminals of the third and fourth low-voltage NMOS transistors receive the fourth bias voltage;
the gate terminals of the fifth, sixth, and seventh low-voltage NMOS transistors receive the fifth bias voltage;
the gate terminal of the eighth low-voltage PMOS transistor is connected to the drain terminal of the seventh low-voltage PMOS transistor; and
the output voltage signal is taken from the drain terminals of the eighth low-voltage PMOS transistor and the seventh low-voltage NMOS transistor.

9. The semiconductor device of claim 6, wherein the folded cascode differential amplifier includes a first cascode MOS transistor connected between the first power supply and the differential pair, the first cascode MOS transistor having a breakdown voltage lower than the breakdown voltages of the first plurality of MOS transistors, and the bias circuit further comprises:
a second cascode MOS transistor connected between the first power supply and the second current minor circuit, for generating a bias voltage for the first cascode MOS transistor in the folded cascode differential amplifier; and
a fifth plurality of MOS transistors forming a fourth current mirror circuit connected between the second current minor circuit and ground; wherein
the second cascode MOS transistor and the fifth plurality of MOS transistors have lower breakdown voltages than the third plurality of MOS transistors.

10. The semiconductor device of claim 9, wherein:
the bias circuit further comprises a second constant current source for generating a second constant current;
the second current mirror circuit includes first and second high-voltage PMOS transistors and zeroth to fourth high-voltage NMOS transistors having respective source, gate, and drain terminals;
the third current minor circuit includes first to third low-voltage PMOS transistors and first and second low-voltage NMOS transistors having respective source, gate, and drain terminals;
the fourth current minor circuit includes first to fourth minor NMOS transistors having respective source, gate, and drain terminals;
the first and second cascode transistors are PMOS transistors having respective source, gate, and drain terminals;
the source terminals of the first high-voltage PMOS transistor and the second cascode transistor are connected to the first power supply;
the source terminals of the first, second, and third low-voltage PMOS transistors are connected to the second power supply;
the source terminals of the first, second, third, and fourth mirror NMOS transistors and the source terminals of the first and second low-voltage NMOS transistors are connected to ground;
the drain terminal of the zeroth high-voltage NMOS transistor is connected to the second constant current source to receive the second constant current;
the drain terminal of the first high-voltage NMOS transistor is connected to the first constant current source to receive the first constant current;
the source terminal of the first high-voltage NMOS transistor is connected to the drain terminal of the first mirror NMOS transistor;
the drain terminals of the first high-voltage PMOS transistor and the second high-voltage NMOS transistor are mutually interconnected;
the source terminal of the second high-voltage NMOS transistor is connected to the drain terminal of the second mirror NMOS transistor;
the drain terminal of the second cascode transistor is connected to the source terminal of the second high-voltage PMOS transistor;
the drain terminals of the second high-voltage PMOS transistor and the third high-voltage NMOS transistor are mutually interconnected;
the source terminal of the third high-voltage NMOS transistor is connected to the drain terminal of the third mirror NMOS transistor;
the drain terminals of the first low-voltage PMOS transistor and the fourth high-voltage NMOS transistor are mutually interconnected;
the source terminal of the fourth high-voltage NMOS transistor is connected to the drain terminal of the fourth minor NMOS transistor;
the drain terminals of the second low-voltage PMOS transistor and the first low-voltage NMOS transistor are mutually interconnected;
the drain terminals of the third low-voltage PMOS transistor and the second low-voltage NMOS transistor are mutually interconnected;
the gate terminals of the first and second high-voltage PMOS transistors are connected to the drain terminal of the first high-voltage PMOS transistor;
the gate terminal of the second cascode transistor is connected to the drain terminal of the second high-voltage PMOS transistor;
the gate terminals of the zeroth, first, second, third, and fourth high-voltage NMOS transistors and the gate terminals of the first, second, third, and fourth minor NMOS transistors are connected to the drain terminal of the first high-voltage NMOS transistor;
the gate terminals of the first, second, and third low-voltage PMOS transistors are connected to the drain terminal of the first low-voltage PMOS transistor;
the gate and drain terminals of the first low-voltage NMOS transistor are mutually interconnected;
the gate and drain terminals of the second low-voltage NMOS transistor are mutually interconnected;
a first bias voltage is output from the drain terminal of the second high-voltage PMOS transistor;

a second bias voltage is output from the drain terminal of the first high-voltage PMOS transistor;
a third bias voltage is output from the drain terminal of the first low-voltage PMOS transistor;
a fourth bias voltage is output from the drain terminal of the first low-voltage NMOS transistor; and
a fifth bias voltage is output from the drain terminal of the second low-voltage NMOS transistor.

11. The semiconductor device of claim 10, wherein:
the input stage of the folded cascode differential amplifier includes fourth to sixth high-voltage PMOS transistors having respective source, gate, and drain terminals, the fifth and sixth high-voltage PMOS transistors constituting the differential pair;
the output stage of the folded cascode differential amplifier includes fourth to eighth low-voltage PMOS transistors and third to seventh low-voltage NMOS transistors having respective source, gate, and drain terminals;
the source terminal of the first cascode transistor is connected to the first power supply;
the source terminals of the fourth, fifth, and eighth low-voltage PMOS transistors are connected to the second power supply;
the drain terminal of the first cascode transistor is connected to the source terminal of the fourth high-voltage PMOS transistor;
the drain terminal of the fourth high-voltage PMOS transistor is connected to the source terminals of the fifth and sixth high-voltage PMOS transistors;
the drain terminal of the fourth low-voltage PMOS transistor is connected to the source terminal of the sixth low-voltage PMOS transistor;
the drain terminals of the sixth low-voltage PMOS transistor and the third low-voltage NMOS transistor are mutually interconnected;
the source terminal of the third low-voltage NMOS transistor is connected to the drain terminals of the fifth high-voltage PMOS transistor and the fifth low-voltage NMOS transistor;
the drain terminal of the fifth low-voltage PMOS transistor is connected to the source terminal of the seventh low-voltage PMOS transistor;
the drain terminals of the seventh low-voltage PMOS transistor and the fourth low-voltage NMOS transistor are mutually interconnected;
the source terminal of the fourth low-voltage NMOS transistor is connected to the drain terminals of the sixth high-voltage PMOS transistor and the sixth low-voltage NMOS transistor;
the drain terminals of the eighth low-voltage PMOS transistor and the seventh low-voltage NMOS transistor are mutually interconnected;
the gate terminal of the first cascode transistor receives the first bias voltage;
the gate terminal of the fourth high-voltage PMOS transistor receives the second bias voltage;
the gate terminals of the fifth and sixth high-voltage PMOS transistors receive the respective input voltage signals;
the gate terminals of the fourth and fifth low-voltage PMOS transistors are connected to the drain terminal of the sixth low-voltage PMOS transistor;
the gate terminals of the sixth and seventh low-voltage PMOS transistors receive the third bias voltage;
the gate terminals of the third and fourth low-voltage NMOS transistors receive the fourth bias voltage;
the gate terminals of the fifth, sixth, and seventh low-voltage NMOS transistors receive the fifth bias voltage;
the gate terminal of the eighth low-voltage PMOS transistor is connected to the drain terminal of the seventh low-voltage PMOS transistor; and
the output voltage signal is taken from the drain terminals of the eighth low-voltage PMOS transistor and the seventh low-voltage NMOS transistor.

* * * * *